(12) United States Patent
Kalla et al.

(10) Patent No.: US 10,388,357 B2
(45) Date of Patent: Aug. 20, 2019

(54) ACTIVATION OF MEMORY CORE CIRCUITS IN AN INTEGRATED CIRCUIT

(71) Applicant: International Business Machines Corporation, Armonk, NY (US)

(72) Inventors: Thomas Kalla, Boeblingen (DE); Jens Noack, Eglfing (DE); Juergen Pille, Stuttgart (DE); Philipp Salz, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/831,436

(22) Filed: Dec. 5, 2017

(65) Prior Publication Data

US 2019/0019548 A1   Jan. 17, 2019

Related U.S. Application Data

(63) Continuation of application No. 15/647,410, filed on Jul. 12, 2017, now Pat. No. 10,210,923.

(51) Int. Cl.
| | | |
|---|---|---|
| *G11C 7/00* | (2006.01) | |
| *G11C 11/4072* | (2006.01) | |
| *G11C 7/10* | (2006.01) | |
| *G11C 11/406* | (2006.01) | |
| *G11C 11/4076* | (2006.01) | |
| *G11C 11/4093* | (2006.01) | |

(Continued)

(52) U.S. Cl.
CPC ........ *G11C 11/4072* (2013.01); *G11C 7/1006* (2013.01); *G11C 7/1045* (2013.01); *G11C 7/222* (2013.01); *G11C 7/225* (2013.01); *G11C 11/406* (2013.01); *G11C 11/408* (2013.01); *G11C 11/4076* (2013.01); *G11C 11/4093* (2013.01); *G11C 11/4096* (2013.01); *G11C 29/83* (2013.01); *G11C 8/12* (2013.01)

(58) Field of Classification Search
CPC . G11C 11/4072; G11C 7/1006; G11C 7/1045; G11C 11/406; G11C 11/4076; G11C 11/4093; G11C 29/83
USPC .............................................. 365/193, 233.1
See application file for complete search history.

(56) References Cited

U.S. PATENT DOCUMENTS 5,546,343 A * 8/1996 Elliott ................. G06F 9/30043
365/189.04
6,198,678 B1 * 3/2001 Albon .................. G11C 7/1006
365/185.25

(Continued)

OTHER PUBLICATIONS

Appendix P, List of IBM Patents or Patent Applications Treated as Related, 2 pages, dated Jan. 11, 2018.

(Continued)

*Primary Examiner* — Viet Q Nguyen
(74) *Attorney, Agent, or Firm* — Christopher K. McLane (57) ABSTRACT

In an approach to activating at least one memory core circuit of a plurality of memory core circuits in an integrated circuit, one or more computer processors activate a clock signal of a currently selected memory core circuit. The one or more computer processors activate the clock signal of a previously selected memory core circuit to allow the previously selected memory core circuit to be set to a deselected operating mode. The one or more computer processors forward an output bit generated by a memory core circuit selected from a plurality of memory core circuits to a multiplexed bit line.

6 Claims, 4 Drawing Sheets

(51) Int. Cl.
*G11C 29/00* (2006.01)
*G11C 7/22* (2006.01)
*G11C 11/408* (2006.01)
*G11C 11/4096* (2006.01)
*G11C 8/12* (2006.01)

(56) References Cited

U.S. PATENT DOCUMENTS

| | | | |
|---|---|---|---|
| 6,292,425 B1 | 9/2001 | Al-Shamma et al. | |
| 6,324,113 B1 | 11/2001 | Tomita | |
| 6,667,933 B2 | 12/2003 | Tomita | |
| 6,928,026 B2* | 8/2005 | Anvar | G06F 13/4086 |
| | | | 365/233.16 |
| 7,099,208 B2 | 8/2006 | Okuyama et al. | |
| 7,254,090 B2 | 8/2007 | Hara et al. | |
| 7,675,773 B2 | 3/2010 | Mori et al. | |
| 7,916,570 B2* | 3/2011 | Ware | G11C 5/14 |
| | | | 365/230.03 |
| 8,295,381 B2* | 10/2012 | Mohammed | H04L 25/03006 |
| | | | 370/203 |
| 8,659,963 B2* | 2/2014 | Dengler | G11C 7/12 |
| | | | 365/203 |
| 8,854,910 B2 | 10/2014 | Park | |
| 8,873,329 B1* | 10/2014 | Zheng | G11C 8/08 |
| | | | 365/230.01 |
| 9,158,355 B2* | 10/2015 | Sutardja | G06F 1/3203 |
| 9,275,699 B2* | 3/2016 | Gopalakrishnan | G11C 7/1075 |
| 9,590,634 B1* | 3/2017 | Park | H03K 19/17724 |
| 9,640,231 B1* | 5/2017 | Ahmed | G11C 7/065 |
| 10,204,674 B2* | 2/2019 | Kalla | G11C 11/4072 |
| 10,210,923 B2* | 2/2019 | Kalla | G11C 11/4072 |
| 2001/0050874 A1 | 12/2001 | Al-Shamma et al. | |
| 2005/0166033 A1 | 7/2005 | Jacob | |
| 2005/0268024 A1 | 12/2005 | Seo et al. | |
| 2006/0187727 A1 | 8/2006 | Hardee | |
| 2006/0262631 A1 | 11/2006 | Kwak | |
| 2007/0030746 A1* | 2/2007 | Best | G11C 11/406 |
| | | | 365/222 |
| 2008/0123451 A1 | 5/2008 | Rao | |
| 2009/0097346 A1 | 4/2009 | Rao | |
| 2010/0080075 A1 | 4/2010 | Kunce et al. | |
| 2012/0262196 A1 | 10/2012 | Yokou | |
| 2014/0103959 A1 | 4/2014 | Andreev et al. | |
| 2015/0098267 A1 | 4/2015 | Jain et al. | |

OTHER PUBLICATIONS

Kalla et al., "Activation of Memory Core Circuits in an Integrated Circuit", U.S. Appl. No. 15/851,792, filed Dec. 22, 2017, 21 pages.
Appendix P, List of IBM Patents or Patent Applications Treated as Related, 2 pages, dated Dec. 6, 2017.
Kalla et al., "Activation of Memory Core Circuits in an Integrated Circuit", U.S. Appl. No. 15/647,410, filed Jul. 12, 2017, 24 pages.
Kalla et al., "Activation of Memory Core Circuits in an Integrated Circuit", U.S. Appl. No. 16/371,390, filed Apr. 1, 2019, 20 pages.
IBM Appendix P, list of patents and patent applications treated as related, File Herewith, 2 pages.

* cited by examiner

FIG. 4

ACTIVATION OF MEMORY CORE CIRCUITS IN AN INTEGRATED CIRCUIT

BACKGROUND OF THE INVENTION

The present invention relates generally to the field of data processing systems, and in particular, to integrated circuits comprising memory core circuits.

An integrated circuit is a set of electronic circuits on one small flat piece of semiconductor material which can be made of materials like silicon. Integrating large numbers of tiny transistors into a small chip results in circuits that are orders of magnitude smaller, cheaper, and faster than those constructed on discrete electronic components. The reliability of integrated circuits and building block approach to circuit designs cement integrated circuits as the standard in place of designs using discrete transistors. Integrated circuits are used in virtually all electronic equipment and are now inextricable parts of the structure of modern societies.

SUMMARY

Embodiments of the present invention disclose an apparatus, a method, and a computer program product for activating at least one memory core circuit of a plurality of memory core circuits in an integrated circuit. The one or more computer processors activate a clock signal of a currently selected memory core circuit. The one or more computer processors activate the clock signal of a previously selected memory core circuit to allow the previously selected memory core circuit to be set to a deselected operating mode. The one or more computer processors forward an output bit generated by a memory core circuit selected from a plurality of memory core circuits to a multiplexed bit line.

DETAILED DESCRIPTION

Present day integrated circuits utilize synchronized dynamic random access memory. Synchronized dynamic random access memory (SDRAM) devices are utilized in various computing devices and are accessed by various types of processors. An SDRAM controller generates signals for controlling read and write operations in response to commands and addresses from a master, for example a master processor. When a memory cell of an SDRAM is accessed, a row (or a word line) on which the memory cell is placed activates. One function of the SDRAM controller is to determine whether a row to be accessed is presently activated. If the row is not activated, the SDRAM controller activates the row prior to a read or write access involving the row. The other function of the SDRAM controller is to inactivate a previously activated row when the SDRAM controller grants access to a new row.

The SDRAM performs a precharge operation following read/write operations in order to maintain the status of stored data. When the precharge operation is performed, a formerly activated row inactivates and columns (or bit lines) set to a precharge voltage (e.g., VCC/2). This precharge operation typically requires several clock cycles to complete, such as two or three clock cycles. When rows in the same bank of the SDRAM are continuously accessed, the precharge operation is performed even though it is not required.

Static random access memory (SRAM) is a type of volatile digital memory that retains data written to it as long as power is applied to the SRAM. One type of SRAM commonly used in high performance computational circuits is referred to as a "ripple domino" SRAM.

At present, the cells are arranged into groups of cells of typically in the order of 16 to 64 cells per group in domino SRAM designs. Each cell in a group connects to a local bit line pair and the local bit line pair for each group of cells couples to a global bit line pair. Rather than using a sense amplifier to detect a differential voltage when reading a cell, the local bit lines are discharged by the cell in a read operation in a ripple domino read SRAM scheme. The state of the cell may then be determined when the domino read SRAM scheme detects a charge. The dynamic data is usually captured in a dynamic to static conversion circuit such as a set-reset-latch. Before such a read operation the set-reset-latch has to be reset and the bit lines have to be in a precharge state.

As used herein, memory core circuits are parts of memory array structures, particularly two-dimensional array structures, more particularly monolithic array circuits comprising caches, status register, and the like. A memory core may comprise a part of an address space and thus part of SRAM cells, e.g., memory cores interconnected via local and global bit lines.

Memory core circuits in integrated circuits may comprise a plurality of memory banks with independent global bit lines and global bit line latches. For example, memory core circuits may use exclusive NAND gates (XNANDs) as set/reset latches. Address space, such as decoded most significant bits (MSBs), may be used to select the requested active memory core circuit. Data from the addressed bit line may be selectively propagated to the array data out. A significant part of the power consumption of a read operation of the memory core circuits is required to reset/restore global bit lines and the global bit line latches.

Advantageously, the present invention avoids slowing down the data path and distributing global, timing critical signals. Further, the present invention saves power to reset/restore all bit lines during a read operation. As a result, the present invention lowers the load on clock signals involved in memory core circuit selection while fulfilling timing requirements. Additionally, the present invention addresses power consumption and wire routability tradeoffs.

The present invention details a state machine associated with a history function which is evaluated to control bit line capture latches. The state machine keeps track of the usage of the memory core circuits. Depending on the evaluation of the history function, a subset of the capture latches (e.g. XNANDs) may be precharged or reset. The state machine does not use any additional signals, such as clock signals, for control. Unlike a multiplexer, the state machine avoids data bus slow down. Further, the state machine reduces the wiring on the integrated circuit. Compared to a solution using a discrete or distributed multiplexer at the output to connect the desired memory core circuit to the output, the present invention avoids the distribution of timing critical select signals and additional logic in the data path.

Compared to solutions involving simple OR-logic connecting the global bit line latch outputs as the data outputs while deactivating the clocking and resetting/fencing the capture latch of the memory core circuit, the present invention reduces power consumption by avoiding using the OR logic in order to ensure the proper function of the OR (or AND) gate the unaddressed memory cores to propagate a logical zero (or logical one) state. In the current state of the art, all memory core/bank global bit lines are always restored to the precharge level which consumes additional power to speed up the critical path though. The present invention avoids the aforementioned situation.

The present invention evaluates a state machine associated with a schematic featuring a history function to control the local or global bit line capture latch reset and/or the local or global bit line restore. The integrated circuit proposed by the present invention comprises additional latches to store the global bit line address of the last active read cycle. The integrated circuit only resets the memory core circuit read in the current cycle and the memory core circuit read in the last cycle. The integrated circuit does not clock memory core circuits that do not need to be clocked which allows the memory core circuits that do not need to be locked to remain on the reset level. The integrated circuit may foresee additional logic to reset all global bit line latches at the power on phase or during an exception state removal, such as an array initialization by a built-in self-test component, at least once. The integrated circuit does not control using any additional signals, such as clock signals. The integrated circuit may be used for static memory arrays as well as for dynamic memory arrays.

Figure 1:
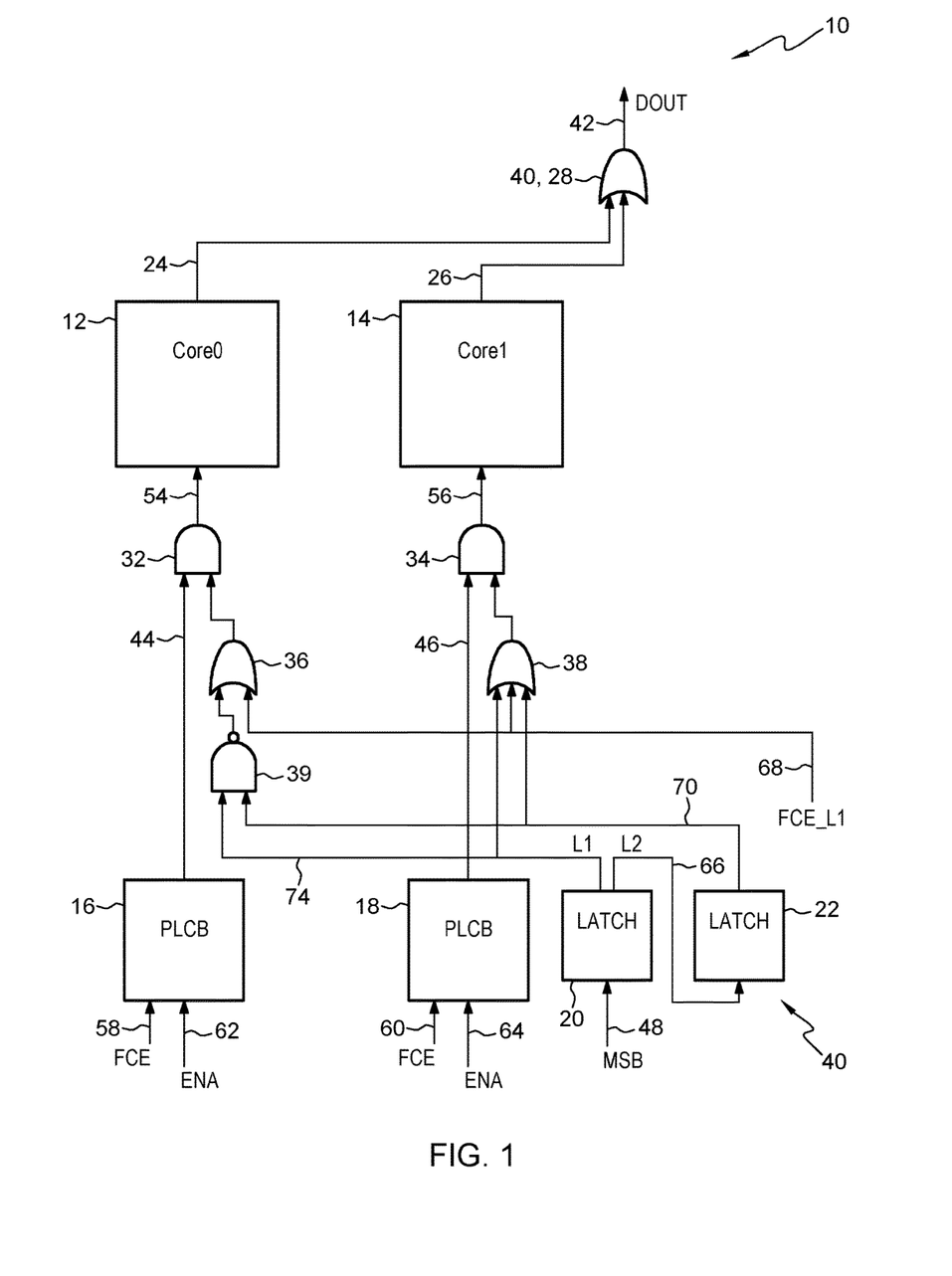
FIG. 1 depicts a data flow of an integrated circuit comprising two memory core circuits and a logic circuitry for activating at least one of the memory core circuits according to an embodiment of the invention.

FIG. 1 depicts a data flow of an integrated circuit 10 comprising two memory core circuits 12, 14 and a logic circuitry 40 for activating at least one of the memory core circuits 12, 14 according to an embodiment of the invention.

Integrated circuit 10 comprises memory core circuit 12 and memory core circuit 14, with outputs 24 and 26 which output at least one output bit each. Memory core circuit 12 and memory core circuit 14 are in a deselected operating mode, wherein the at least one output bit on outputs 24 and 26 are held on an inactive level, respectively. Integrated circuit 10 further comprises a logic circuitry 40 that forwards the output bit generated by memory core circuit 12 and memory core circuit 14 selected from memory core circuit 12 and memory core circuit 14 to multiplexed bit line 42. Logic circuitry 40 comprises a clock gating circuit being configured for activating clock signals 54 and 56 of one or a selected memory core circuit 12 and memory core circuit 14 and for activating clock signals 54 and 56 of a previously selected memory core circuit 12 and memory core circuit 14, via controlling a gating of clock 44 and clock 46, in order to allow the previously selected memory core circuit 12 and memory core circuit 14 to be set to the deselected operating mode if memory core circuit 12 and memory core circuit 14 are currently selected for reading and memory core circuit 12 and memory core circuit 14 were previously selected.

The logic circuitry 40 may reside on different components and may comprise a storage element 22 configured for storing information regarding whether or not a specific memory core circuit 12 and memory core circuit 14 were previously selected. Further, a clock gating circuit may keep clock signal 54 and clock signal 56 of memory core circuit 12 and memory core circuit 14 activated if the information stored in storage element 22 indicates that memory core circuit 12 and memory core circuit 14 activated previously. A clock gating circuit may drive clock gates 32 and clock gate 34, which may be implemented as a logic gate, such as an AND gate driving the clock signal 54 and clock signal 56 and/or implementing a precharge clock and/or XNAND/set/reset latch clock. The polarity of the driving signal depends on the type of clock gate 32 and clock gate 34.

The inactive level of the output bit in the embodiment shown corresponds to a logical value of zero ("logical zero"). Logic levels, such as logical zero and logical one, corresponding to the finite number of states that a digital signal can inhabit. Therefore, logic circuitry 40 comprises OR gate 28 for combining the output bits of memory core circuits 12 and memory core circuit 14 to a signal on the multiplexed bit line 42 for propagating a logical zero if inactive output bits exist. Thus, OR gate 28 may switch multiplexed bit line 42.

In an alternative embodiment, if the inactive level also corresponds to a logical zero, the logic circuitry 40 may comprise a NOR gate for propagating a logical value of one in the case of inactive output bits.

In a further alternative embodiment, if the inactive level corresponds to a logical value of one ("logical one"), the logic circuitry 40 may comprise an AND gate for combining the output bits of the plurality of memory core circuit 12 and memory core circuit 14 to a signal on multiplexed bit line 42 for propagating a logical one in the case of the output bits being inactive.

In yet another alternative embodiment, if the inactive level also corresponds to a logical one, the logic circuitry 40 may comprise a NAND gate for propagating a logical zero in the case of inactive output bits.

At least one of memory core circuit 12 and memory core circuit 14 may comprise a memory bank and logic circuitry 40 may select a memory bank based on at least one address bit 48.

The logic circuitry may be configured to precharge or reset output 24 and output 26 of the plurality of memory core circuit 12 and memory core circuit 14 upon a power-on phase or an exception state removal or an initialization of one of memory core circuit 12 and memory core circuit 14. Further, the memory core circuit 12 and memory core circuit 14 may precharge or reset output line 24 and output line 26 when performing a built-in self-test. In the embodiment shown in FIG. 1, force clock enable (FCE) signal 68 executes the built-in self-test.

The storage element 22 may be a latch. First latch 20 delivers the input for storage element 22 which receives most significant bit (MSB) 48 of a memory core cell address and an input and a first address latch signal L1 74 to an AND gate 39 and a second address latch signal L2 66 to storage element 22 as an output.

In an embodiment of the invention, integrated circuit 10 further comprises programmable local clock buffers (PLCB) 16 and PLCB 18 for propagating clock signal 44 and clock signal 46, enabled by enable (ENA) signal 62 and ENA signal 64 and force clock enable (FCE) signal 58 and FCE signal 60.

Integrated circuit 10 further comprises OR gate 36 and OR gate 38 that deliver additional inputs for clock gate 32 and clock gate 34. Force clock enable L1 signal 68 provide OR gate 36 and OR gate 38. Storage element 22 outputs signal 70 to NAND gate 39 and to OR gate 38.

Integrated circuit 10 depicted in FIG. 1 implements a method for activating at least one memory core circuit 12 and memory core circuit 14 in integrated circuit 10. In the present invention, clock signal 44 of a currently selected configuration of memory core circuit 12 activates. Clock signal 46 of the previously selected memory core circuit 14 activates in order to allow a previously selected configuration of memory core circuit 14 to set to a deselected operating mode. Finally, logic circuitry 40 forwards the output bit generated by the memory core circuit 12 and memory core circuit 14 to the multiplexed bit line 42.

Storage element 22 stores information about whether or not memory core circuit 12 and/or memory core circuit 12 were previously selected. Clock signal 54 and clock signal 56 of memory core circuit 14 remains activated if the information stored in the storage element 22 indicates that memory core circuit 14 and memory core circuit 12 were previously activated. For this purpose, logic circuitry 40 performs the function of determining the state of one or more memory core circuits.

Addresses of memory core cells selected for a read process input to first address latch 20 via MSB 48. Output 66 and output 74 of address latch 20 control the signal flow through second address latch 22 as the storage element, NAND gate 39, and OR gate 36 and OR gate 38 in order to enable a clock gating process of AND gate 32 and AND gate 34 for activating one of memory core circuit 12 and memory core circuit 14. Via the signal 68, a force clock enable may disable all related clock gates, such as clock gate 32 and clock gate 34, so that memory core circuit 12 and memory core circuit 14 clock independent of the content of latch 20 and latch 22.

FCE signal 68 and FCE signal 60 may switch from logical zero to logical one for one or more cycles during a power-on phase or a reset phase so that the PLCB 16 and PCLB 18 may generate a clock pulse as clock signal 44 and clock signal 46 which transfers to clock signal 54 and clock signal 56 as FCE signal 68 disables clock gating via clock gate 32 and clock gate 24.

Memory core circuit 12 and memory core circuit 14 are reset by precharge clock 54 and precharge clock 56 so that data output 24 and data output 26 is a value of zero.

After this phase, enable (ENA) signal 62 ENA signal 64 may switch from zero to one in a read operation. The most significant bit (MSB) 48 is logical zero indicating that the read is performed on memory core 12. Other signals such as decoded least significant bit (LSB)/address latches are not shown in FIG. 1 for simplification but may be present in any embodiment of the present invention. As indicated by MSB 48, a read operation executes in the address space of the memory core circuit 12. If a logical one was read from the memory core 12 the output signal 24 remains a logical one until the memory core 12 is reset. The logical one propagates to data out (DOUT) output 42.

In a next cycle, ENA signal 62 may remain high and the MSB 48 may switch to one so that memory core circuit 14 performs a read operation.

MSB 48 of logical one is stored in the latch 20 while the latch 22 stores MSB 48 of logical zero from the preceding cycle. Memory core circuit 12 and memory core circuit 14 then clock and reset. Assuming that logical zero is read the memory core output 26 stays at logical zero and the memory core 12 is again reset to zero driving a zero to memory core output 24. The DOUT 42 also switches to logical zero.

In a next cycle, if ENA signal 62 stays high, then another read operation executes. MSB 48 may remain at logical one so that both latch 20 and latch 22 store a logical one. In this cycle only memory core 14 is clocked as precharge clock 54 for memory core circuit 12 is gated by the logical one driven from NAND gate 39 and OR gate 36.

The following table 1 show the possible input combinations and switching of memory core clock 54 and memory core clock 56. Both memory core circuit 12 and memory core circuit 14 are clocked in the case of a transition or reset associated with MSB 48. Typically, MSB 48 of subsequent read operations does not change every cycle. In the case that MSB 48 of subsequent read operation does not change every cycle, only memory core circuit 12 or memory core circuit 14 is clocked. This an exemplary embodiment and embodiments of the present inventions may be extended to any number of memory cores. For example, the present invention may be extended to four memory cores by including two MSB 48 to logic circuitry 40.

TABLE 1

Possible input combinations and switching of the memory core clocks 54, 56

| FCE 58, 60 | ENA 62, 64 | MSB latch 20 | MSB last cycle latch 22 | Precharge clock 54 | Precharge 56 |
|---|---|---|---|---|---|
| 1 | X | X | X | Clocked | Clocked |
| 0 | 1 | 0 | 0 | Clocked | Gated |
| 0 | 1 | 1 | 0 | Clocked | Clocked |
| 0 | 1 | 0 | 1 | Clocked | Clocked |
| 0 | 1 | 1 | 1 | Gated | Clocked |

Figure 2:
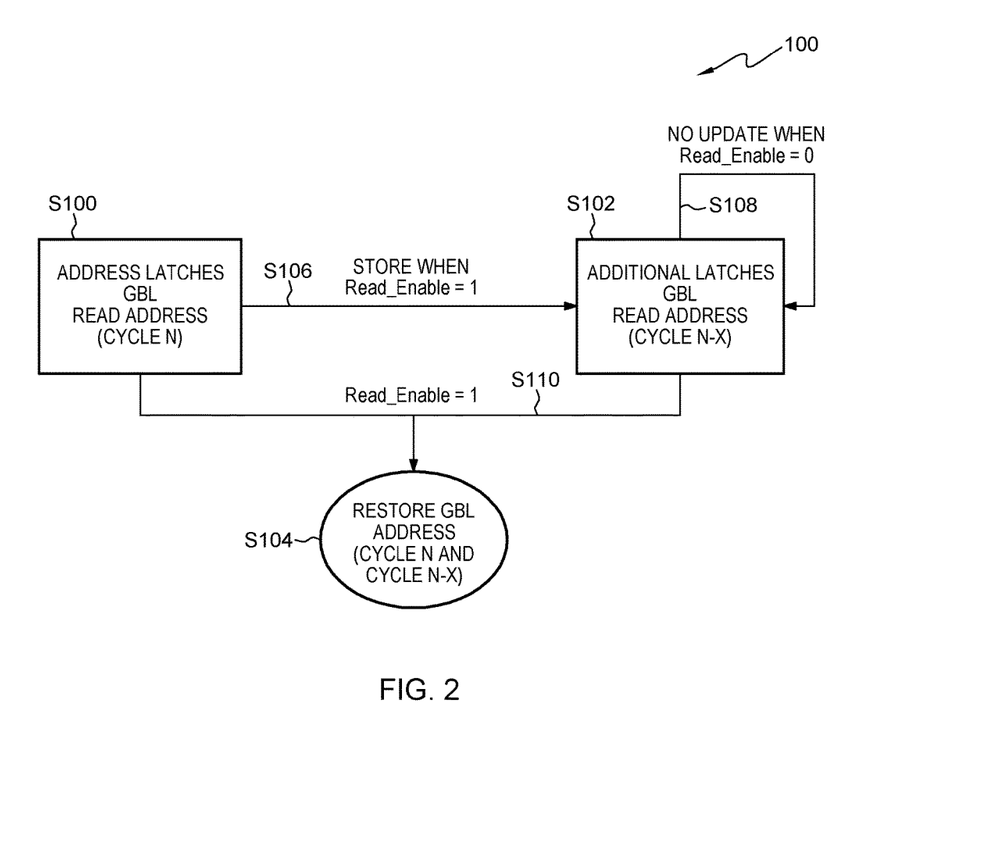
FIG. 2 depicts a state machine for activating at least one of the memory core circuits according to an embodiment of the invention.

FIG. 2 depicts a state machine 100 for activating at least one memory core circuit according to an embodiment of the invention. A read address of address latches on a global bit line (GBL) selected in a cycle N of state S100, is stored when a Read_Enable signal equals to logical one in state S106 as previously selected in a state S102. When the Read_Enable signal equal logical one, GBL addresses restore in state S110 when in a state S104 for the currently selected cycle N as well as the previously selected cycle N-X. The state S102 of the additional latches are not updated as long as the Read_Enable signal equal logical zero in state S108.

Figure 3:
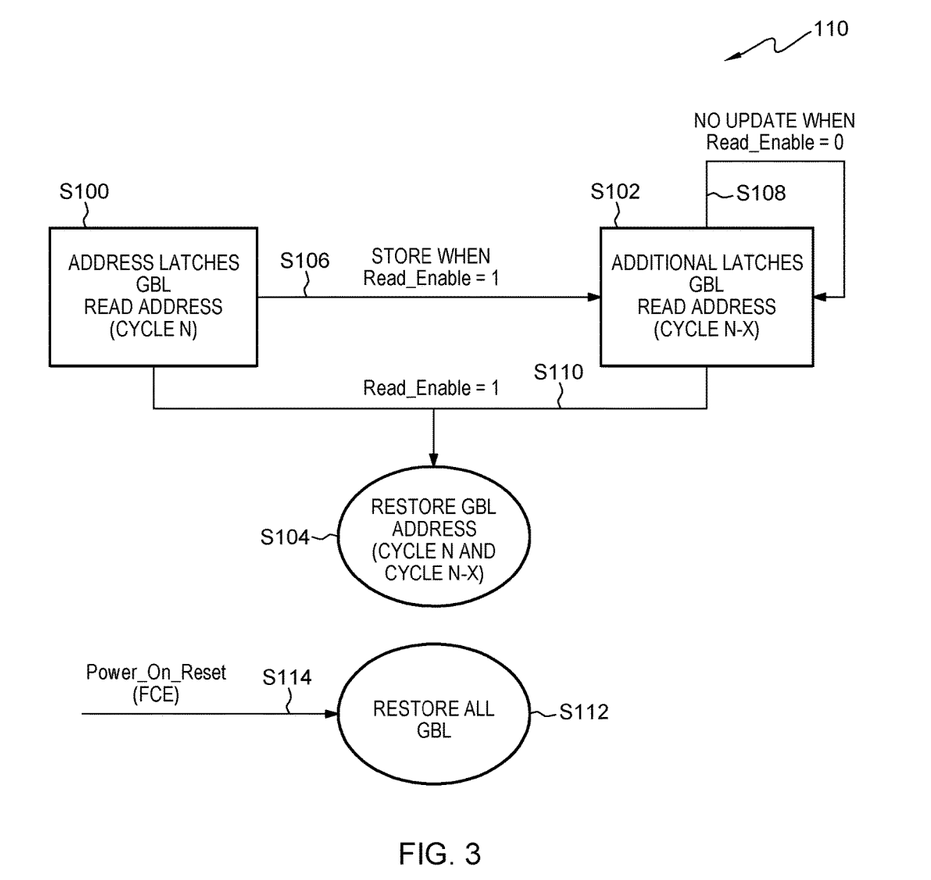
FIG. 3 depicts a state machine for activating at least one of the memory core circuits according to an embodiment of the invention.

FIG. 3 depicts a state machine 110 for activating at least one of the memory core circuits according to a further embodiment of the invention. The state machine 110 shown in FIG. 3 resembles the state machine 100 shown in FIG. 2 with the exception that optional transition S114 for a Power-On_Reset which delivers a force clock enable (FCE) leads to a restore of global bit lines S112.

Figure 4:
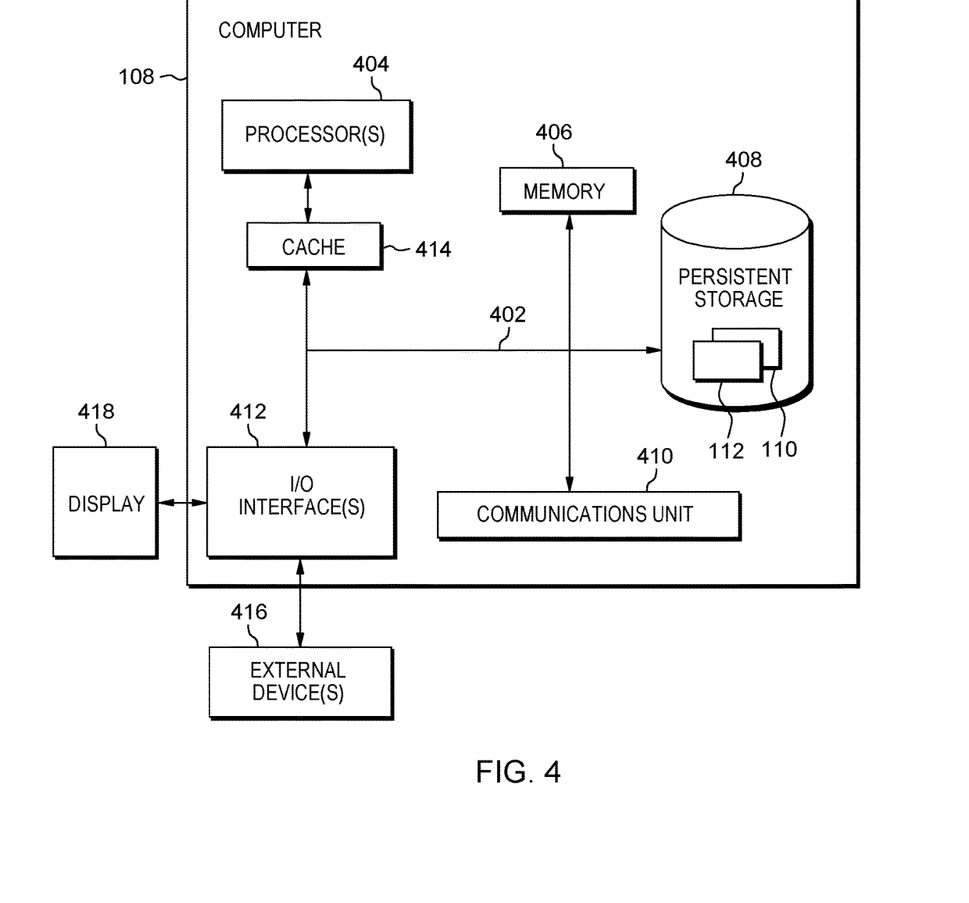
FIG. 4 depicts an exemplary embodiment of a data processing system comprising at least one integrated circuit for executing a method according to the invention.

FIG. 4 depicts a block diagram of components of server computer 108 within distributed data processing environment 100 of FIG. 1, in accordance with an embodiment of the present invention. It should be appreciated that FIG. 4 provides only an illustration of one implementation and does not imply any limitations with regard to the environments in which different embodiments can be implemented. Many modifications to the depicted environment can be made.

Server computer 108 can include processor(s) 404, cache 414, memory 406, persistent storage 408, communications unit 410, input/output (I/O) interface(s) 412 and communications fabric 402. Communications fabric 402 provides communications between cache 414, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer readable storage media. In this embodiment, memory 406 includes random access memory (RAM). In general, memory 406 can include any suitable volatile or non-volatile computer readable storage media. Cache 414 is a fast memory that enhances the performance of processor(s) 404 by holding recently accessed data, and data near recently accessed data, from memory 406.

Program instructions and data used to practice embodiments of the present invention, e.g., program module 110 and database 112, are stored in persistent storage 408 for execution and/or access by one or more of the respective processor(s) 404 of server computer 108 via cache 414. In this embodiment, persistent storage 408 includes a magnetic hard disk drive. Alternatively, or in addition to a magnetic hard disk drive, persistent storage 408 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 508.

Communications unit 410, in these examples, provides for communications with other data processing systems or devices, including resources of computing device 104. In these examples, communications unit 410 includes one or more network interface cards. Communications unit 410 may provide communications through the use of either or both physical and wireless communications links. Program module 110, database 112, and other programs and data used for implementation of the present invention, may be downloaded to persistent storage 408 of server computer 108 through communications unit 410.

I/O interface(s) 412 allows for input and output of data with other devices that may be connected to server computer 108. For example, I/O interface(s) 412 may provide a connection to external device(s) 416 such as a keyboard, a keypad, a touch screen, a microphone, a digital camera, and/or some other suitable input device. External device(s) 416 can also include portable computer readable storage media such as, for example, thumb drives, portable optical or magnetic disks, and memory cards. Software and data used to practice embodiments of the present invention, e.g., program module 110 and database 112 on server computer 108, can be stored on such portable computer readable storage media and can be loaded onto persistent storage 408 via I/O interface(s) 412. I/O interface(s) 412 also connect to a display 418.

Display 418 provides a mechanism to display data to a user and may be, for example, a computer monitor. Display 518 can also function as a touchscreen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

What is claimed is:

1. A method for activating at least one memory core circuit of a plurality of memory core circuits in an integrated circuit, the method comprising:
   activating, by one or more computer processors, a clock signal of a currently selected memory core circuit;
   activating, by the one or more computer processors, the clock signal of a previously selected memory core circuit to allow the previously selected memory core circuit to be set to a deselected operating mode; and
   forwarding, by the one or more computer processors, an output bit generated by the previously selected memory core circuit selected from a plurality of memory core circuits to a multiplexed bit line.

2. The method of claim 1, further comprising:
   storing, by the one or more computer processors, information regarding whether a specific memory core circuit was previously selected in a storage element; and
   maintaining, by the one or more computer processors, an activated state of the clock signal of the specific memory core circuit based on the information stored in the storage element indicating that the specific memory core was previously activated.

3. A computer program product for activating at least one memory core circuit of a plurality of memory core circuits in an integrated circuit, the computer program product comprising:
   one or more computer readable storage media and program instructions stored on the one or more computer readable storage media, the program instructions comprising:
   program instructions to activate a clock signal of a currently selected memory core circuit;
   program instructions to activate the clock signal of a previously selected memory core circuit to allow the previously selected memory core circuit to be set to a deselected operating mode; and
   program instructions to forward an output bit generated by the previously selected memory core circuit selected from a plurality of memory core circuits to a multiplexed bit line.

4. The computer program product of claim 3, further comprising:
   program instructions to store information regarding whether a specific memory core circuit was previously selected in a storage element; and
   program instructions to maintain an activated state of the clock signal of the specific memory core circuit based on the information stored in the storage element indicating that the specific memory core was previously activated.

5. A computer system for activating at least one memory core circuit of a plurality of memory core circuits in an integrated circuit, the computer system comprising:
   one or more computer processors;
   one or more computer readable storage media;
   program instructions stored on the computer readable storage media for execution by at least one of the one or more computer processors, the program instructions comprising:
   program instructions to activate a clock signal of a currently selected memory core circuit;
   program instructions to activate the clock signal of a previously selected memory core circuit to allow the previously selected memory core circuit to be set to a deselected operating mode; and program instructions to forward an output bit generated by the previously selected memory core circuit selected from a plurality of memory core circuits to a multiplexed bit line.

6. The computer system of claim 5, further comprising:

program instructions to store information regarding whether a specific memory core circuit was previously selected in a storage element; and program instructions to maintain an activated state of the clock signal of the specific memory core circuit based on the information stored in the storage element indicating that the specific memory core was previously activated.

* * * * *